United States Patent
Lin et al.

(10) Patent No.: US 7,996,169 B2
(45) Date of Patent: Aug. 9, 2011

(54) METHOD AND APPARATUS FOR COMPENSATING S-PARAMETERS OF PASSIVE CIRCUITS

(75) Inventors: Yu-Hsu Lin, San Jose, CA (US); Jeng-Da Wu, Taipei Hsien (TW); Chih-Hang Chao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 564 days.

(21) Appl. No.: 12/124,782

(22) Filed: May 21, 2008

(65) Prior Publication Data

US 2009/0171604 A1 Jul. 2, 2009

(30) Foreign Application Priority Data

Dec. 29, 2007 (CN) .......................... 2007 1 0203575

(51) Int. Cl.
*G01R 27/02* (2006.01)
*G01R 17/06* (2006.01)
*G01R 27/04* (2006.01)
*G01N 22/00* (2006.01)

(52) U.S. Cl. ................. 702/75; 702/66; 702/76; 702/81

(58) Field of Classification Search ............... 702/19, 702/57, 66, 75, 81, 92, 119, 181, 187, 189; 324/76.12, 601, 638; 703/14; 704/254
See application file for complete search history.

(56) References Cited

U.S. PATENT DOCUMENTS

| | | | | |
|---|---|---|---|---|
| 4,713,778 A * | 12/1987 | Baker | ................. | 704/254 |
| 4,982,164 A * | 1/1991 | Schiek et al. | ............. | 324/638 |
| 6,614,237 B2 * | 9/2003 | Ademian et al. | ........ | 324/601 |
| 6,836,743 B1 | 12/2004 | Blackham et al. | | |
| 6,998,833 B2 * | 2/2006 | Wang et al. | ............ | 324/76.12 |
| 2003/0088394 A1* | 5/2003 | Min et al. | ................. | 703/14 |

* cited by examiner

*Primary Examiner* — Michael P Nghiem
*Assistant Examiner* — Felix E Suarez
(74) *Attorney, Agent, or Firm* — D. Austin Bonderer

(57) ABSTRACT

The invention related to a method and circuit that is used to compensate for S-parameters of a passive circuit which do not satisfy passivity. The method includes the following steps: (1) getting S-parameters which do not satisfy passivity, these S-parameters being composed of an S-parameter matrix S; (2) computing matrix [S×S'], wherein matrix S' is a complex conjugate transposed matrix of the S-parameter matrix S; (3) computing the eigenvalues of the matrix [S×S'], and choosing an eigenvalue Ψ whose real part real(Ψ) is the biggest; (4) computing a compensating value ξ, the compensating value ξ being equal to real(Ψ)$^{1/2}$×(1+ε), wherein the ε is a very small positive number; and (5) dividing each of the S-parameters by the compensating value ξ to get the compensated S-parameters.

4 Claims, 6 Drawing Sheets

METHOD AND APPARATUS FOR COMPENSATING S-PARAMETERS OF PASSIVE CIRCUITS

BACKGROUND

1. Technical Field

The present invention relates to a method and apparatus for the compensation of S-parameters of a passive circuit, and more particularly to a method to compensate S-parameters to satisfy passivity.

2. Description of Related Art

S-parameters are transmission and reflection coefficients for a circuit computed from measurements of voltage waves traveling toward and away from a port or ports of the circuit. Further, the S-parameters are related to frequency. In general, S-parameters are expressed either in terms of a magnitude and phase or in an equivalent form as a complex number having a real part and an imaginary part. Referring to FIGS. 1 and 2, a passive circuit 10 includes a port 11 and a port 12. A set of four S-parameters, namely $S_{11}$, $S_{12}$, $S_{21}$, and $S_{22}$ each represented by a complex number, provide a complete characterization of the performance of the two ports 11, and 12 of the passive circuit 10 at a single frequency. These S-parameters form an S-parameter matrix. Because the circuit 10 is a passive circuit, the S-parameter matrix should satisfy passivity: real (eigenvalue[E−S×S'])≧0. It means that the real part of the eigenvalue of the matrix [E−S×S'] is not smaller than 0. The matrix S' is a complex conjugate transposed matrix of the S-parameters matrix. However, in many instances, the measured S-parameters do not satisfy passivity for many different reasons, such as directivity and crosstalk related to signal leakage, source and load impedance mismatches related to reflections, and so on.

What is needed, therefore, is a method to compensate for the S-parameters of a passive circuit to satisfy passivity.

SUMMARY

A method is used to compensate for S-parameters of a passive circuit which do not satisfy passivity. The method includes the following steps: (1) getting S-parameters which do not satisfy passivity, these S-parameters being composed of an S-parameter matrix S; (2) computing matrix [S×S'], wherein matrix S' is a complex conjugate transposed matrix of the S-parameter matrix S; (3) computing the eigenvalues of the matrix [S×S'], and choosing an eigenvalue Ψ whose real part real(Ψ) is the biggest; (4) computing a compensating value ξ, the compensating value ξ being equal to real(Ψ)$^{1/2}$× (1+ε), wherein the ε is a very small positive number; and (5) dividing each of the S-parameters by the compensating value ξ to get the compensated S-parameters.

Other advantages and novel features of the present invention will become more apparent from the following detailed description of preferred embodiment when taken in conjunction with the accompanying drawings, in which:

DETAILED DESCRIPTION OF THE INVENTION

Figure 1:
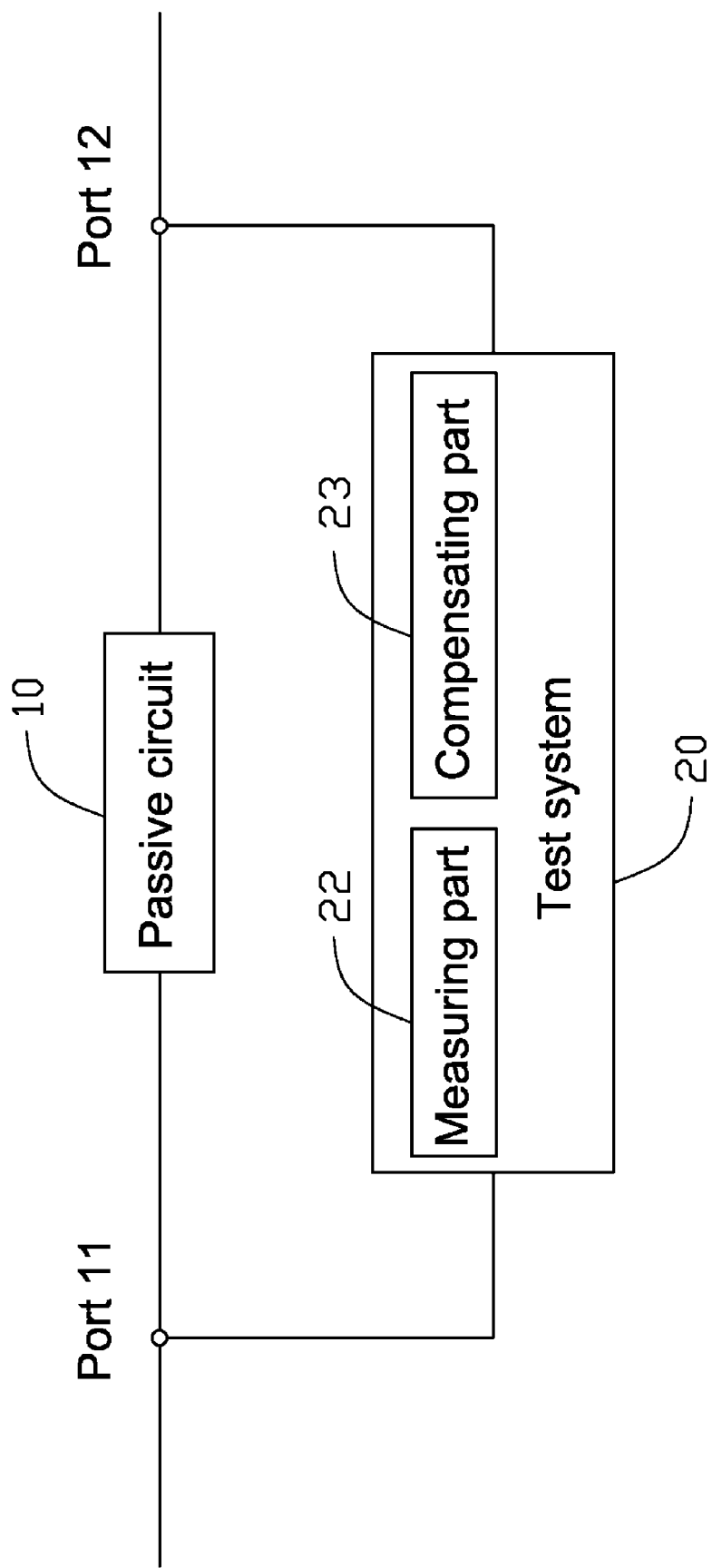
FIG. 1 is a block diagram of a passive circuit connected to a test system.
Figure 2:
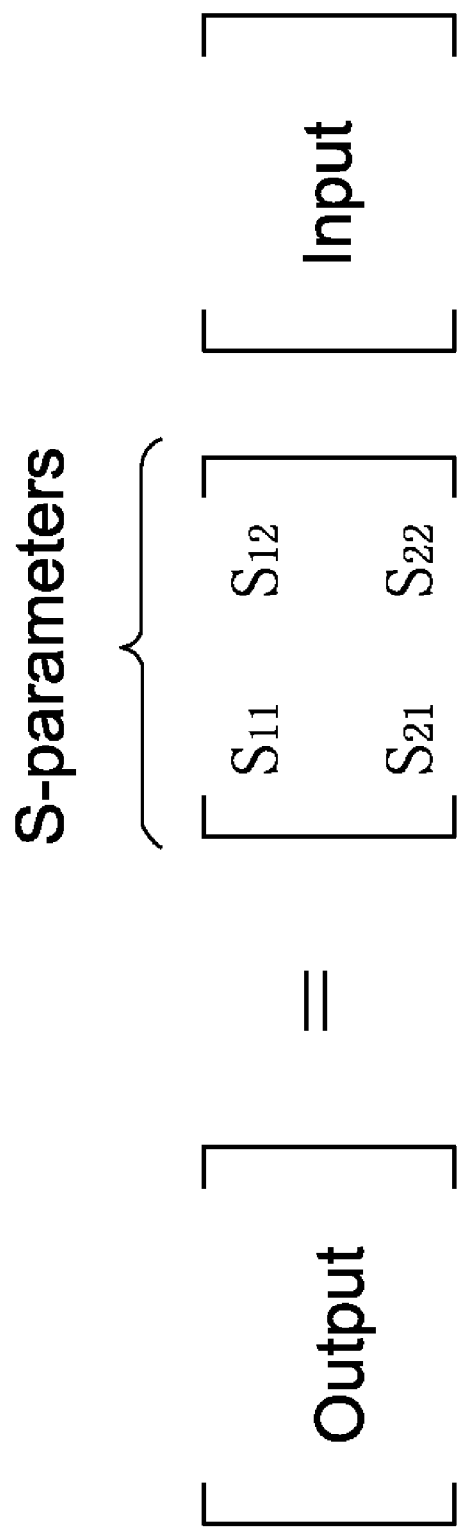
FIG. 2 is a diagram of a relationship between an input and an output of the passive circuit.

Referring to FIG. 1, a test system 20 for measuring S-parameters of the ports 11 and 12 of a passive circuit 10 is shown. The test system 20 includes a measuring part 22 and a compensating part 23.

Figure 3:
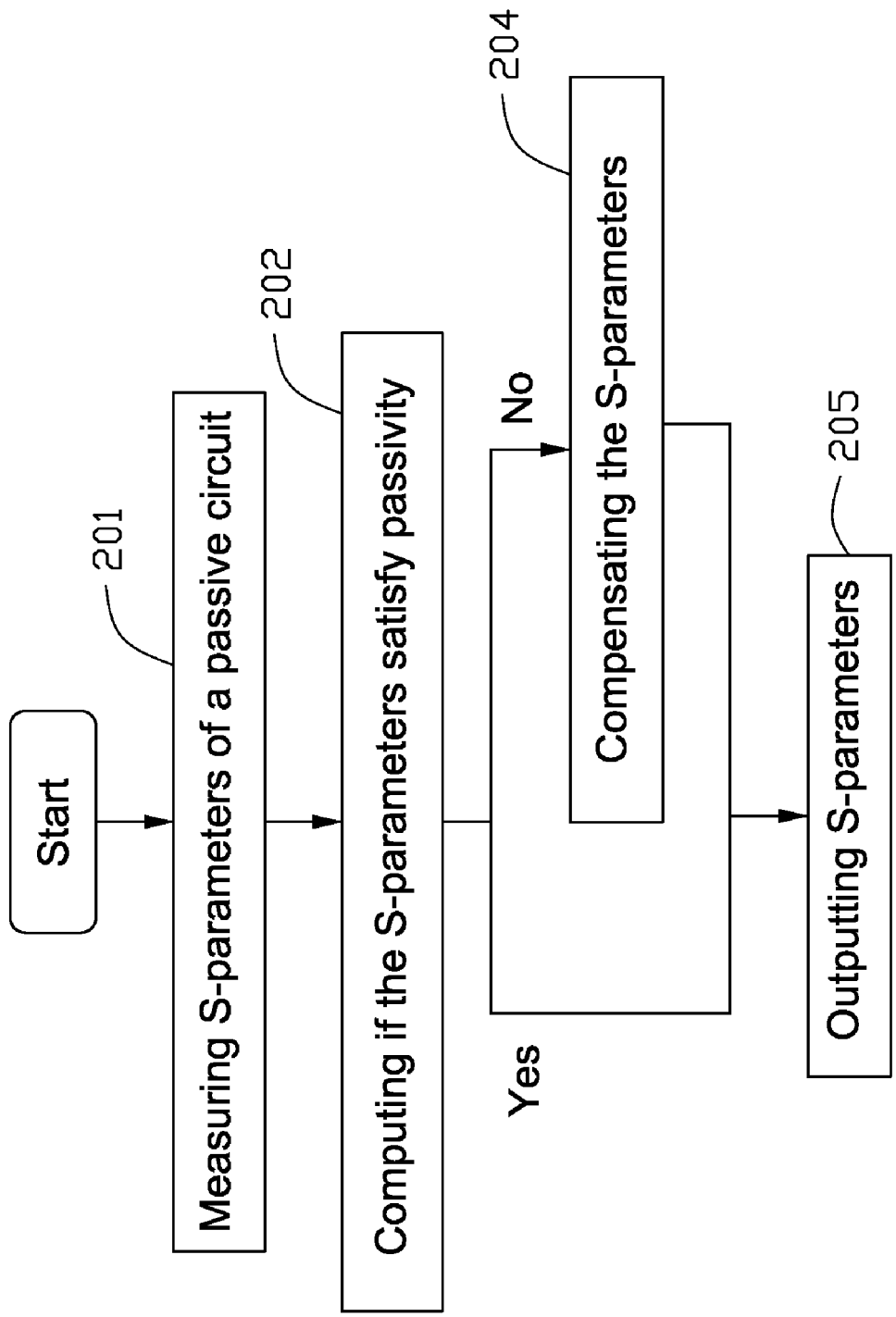
FIG. 3 is a flow diagram of the test system measuring the S-parameters of a circuit.

FIG. 3 shows a flow chart of the test system 20 measuring S-parameters. Firstly, in step 201, the measuring part 22 measures S-parameters of the passive circuit 10 at a given frequency. Then in step 202 the test system 20 then computes if the measured S-parameters satisfy passivity. If the S-parameters satisfy passivity, then in step 205 the test system 20 outputs the original S-parameters. If the S-parameters do not satisfy passivity, then in step 204 the compensating part 23 adjusts the S-parameters to satisfy passivity, then in step 205 the test system 20 outputs the compensated S-parameters.

Figure 4:
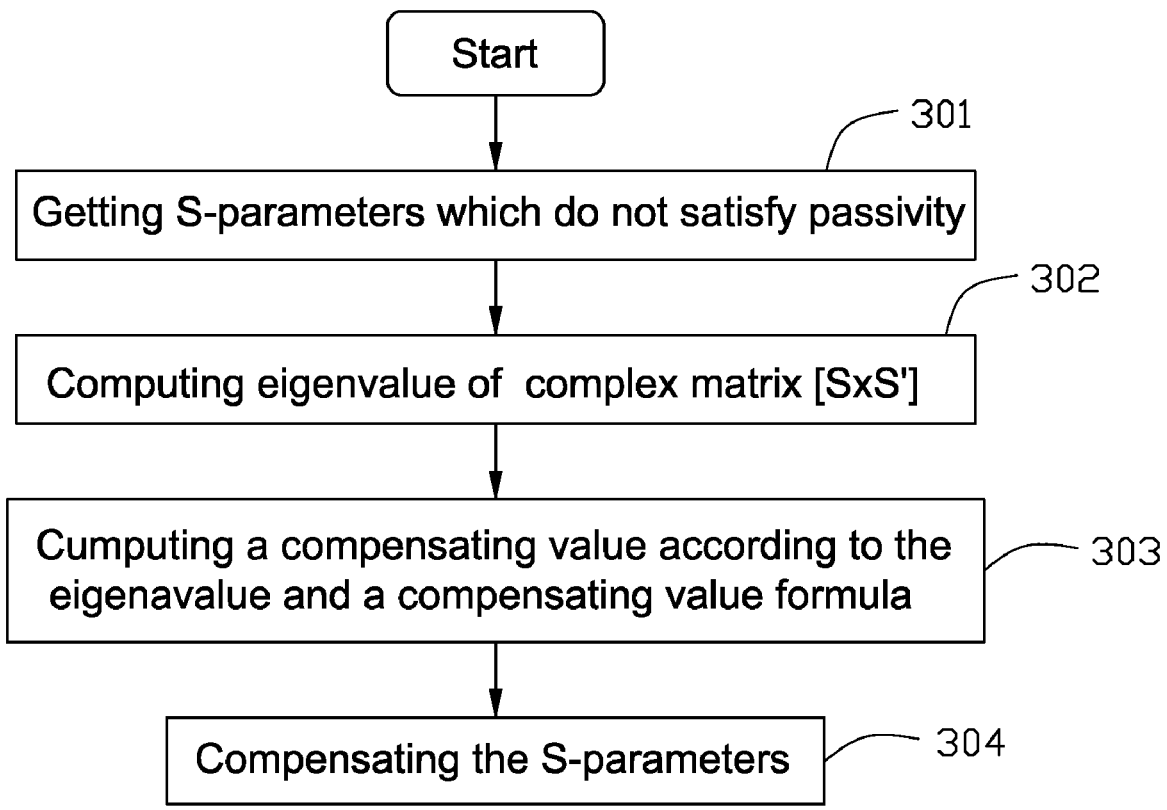
FIG. 4 is a flow diagram of the compensating steps.
Figure 5:
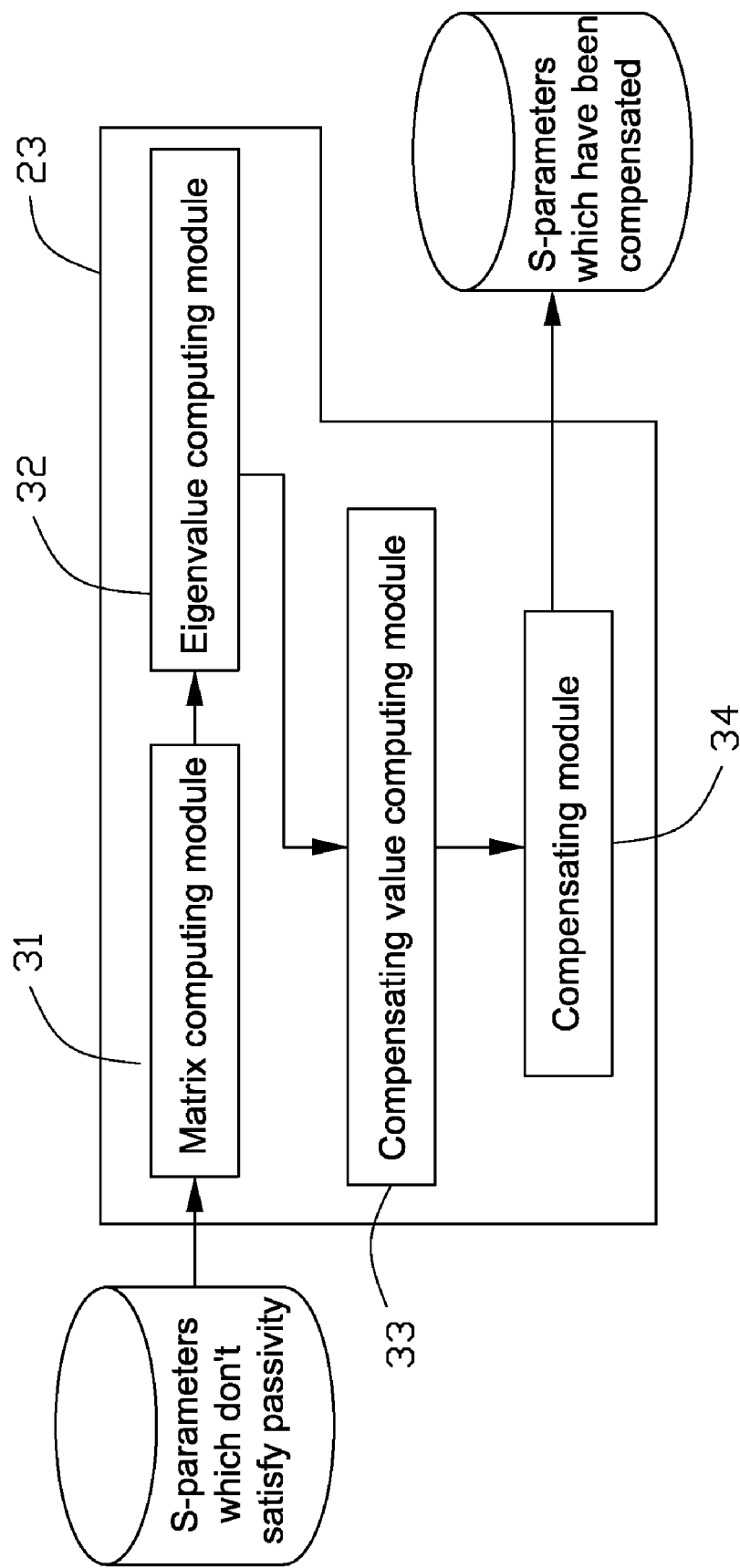
FIG. 5 is a block diagram of a compensating part of the test system of FIG. 1.

Referring to FIGS. 4 and 5, FIG. 4 shows the detailed steps of the step 204 of FIG. 3. FIG. 5 shows modules of the compensating part 23. The compensating part 23 includes a matrix computing module 31, an eigenvalue computing module 32, a compensating value computing module 33, and a compensating module 34. The eigenvalue computing module 32 is connected to the matrix computing module 31, the compensating value computing module 33 is connected to the eigenvalue computing module 32, and the compensating module 34 is connected to the compensating value computing module 33.

The detailed steps of compensating the S-parameters includes the following steps:

Step 301, the compensating part 23 gets the S-parameters that do not satisfy passivity.

Step 302, the matrix computing module 31 computes the matrix [S×S']. The eigenvalue computing module 32 computes the eigenvalues of the matrix [S×S']. Because the S-parameters do not satisfy passivity, there is an eigenvalue λ of the matrix [E−S×S'] whose real part is the smallest, and less than 0, that is real(λ)<0. According to the formula of eigenvalue[E−S×S']=1−eigenvalue[S× S'], there is an eigenvalue Ψ of the matrix [S×S'] whose real part is the biggest, and greater than 1, for real(Ψ)= 1−real(λ)>1.

Step 303, the compensating value computing module 33 then computes a compensating value ξ according to the compensating value formula of ξ=real(Ψ)$^{1/2}$×(1+ε). In the above formula, the ε is a very small positive number.

Step 304, the compensating module 34 compensates the S-parameters according to the compensating formula of S*=S/ξ to get the compensated S-parameters S*. Regarding the compensated S-parameters S*, the estimating formula used to estimate passivity is: real(eigenvalue[E−S*×S*'])=1−real(eigenvalue[S*×S*'])=1−real (eigenvalue[S/ξ×S'/ξ])=1−real(eigenvalue[S×S'])/[real (Ψ)×(1+ε)$^2$]. Because real(Ψ) is greater than 1, ε is a very small positive number, and the real(eigenvalue[S× S']) is not bigger than real(Ψ). Therefore, real(eigenvalue[E−S*×S*'])/real(Ψ)×(1+ε)$^2$ is smaller than 1, and real(eigenvalue[E−S*×S*'])=1−real(eigenvalue[S×S'])/ [real(Ψ)×(1+ε)$^2$]>0. Thus, the compensated S-parameter matrix S* satisfies passivity.

Referring to FIGS. 1 to 5, described below is an embodiment of the compensating method used in a two port passive circuit. The two ports are the same kind of ports. The measuring part 22 measures S-parameters of the two port passive circuit at a given frequency (step 201), and forms an S-parameter matrix $S=[(S_{11}, S_{12}), (S_{21}, S_{22})]$. Because the two ports are the same, $S_{11}$ is equal to $S_{22}$, and $S_{12}$ is equal to $S_{21}$. Therefore, the S-parameter matrix S is equal to $[(S_{11}, S_{12}), (S_{12}, S_{11})]$. In the above equation, $S_{11}$ is $(R_{11}+I_{11}i)$, and $S_{12}$ is $(R_{12}+I_{12}i)$. If in step 202 it is found that the S-parameter matrix S does not satisfy passivity, then step 204 is performed to produce adjusted S-parameters, as detailed below:

Step 301, the compensating part 23 gets the S-parameter matrix $S=[(S_{11}, S_{12}), (S_{12}, S_{11})]$.

Step 302, the matrix computing module 31 computes the matrix $[S \times S']=[(R_{11}^2+R_{12}^2+I_{11}^2+I_{12}^2, 2 \times R_{11} \times R_{12}+2 \times I_{11} \times I_{12}), (2 \times R_{11} \times R_{12}+2 \times I_{11} \times I_{12}, R_{11}^2+R_{12}^2+I_{11}^2+I_{12}^2)]$. The eigenvalue computing module 32 computes the eigenvalues of the matrix $[S \times S']$, and the eigenvalues are $\Psi_1=(I_{11}+I_{12})^2+(R_{11}+R_{12})^2$, and $\Psi_2=(I_{11}-I_{12})^2+(R_{11}-R_{12})^2$. Then, the two eigenvalues are compared to get an eigenvalue $\Psi_{max}$ from the two eigenvalues whose real part is the biggest real part of all the eigenvalues.

Step 303, the compensating value computing module 33 computes a compensating value ξ according to the compensating value formula of $\xi=\text{real}(\Psi_{max})^{1/2} \times (1+\epsilon)$. In the above formula, ε is a very small positive number.

Step 304, the compensating module 34 compensates the S-parameter matrix S according to the compensating module $S^*=S/\xi$ to get the compensated S-parameter matrix $S^*$ which satisfies passivity.

Figure 6:
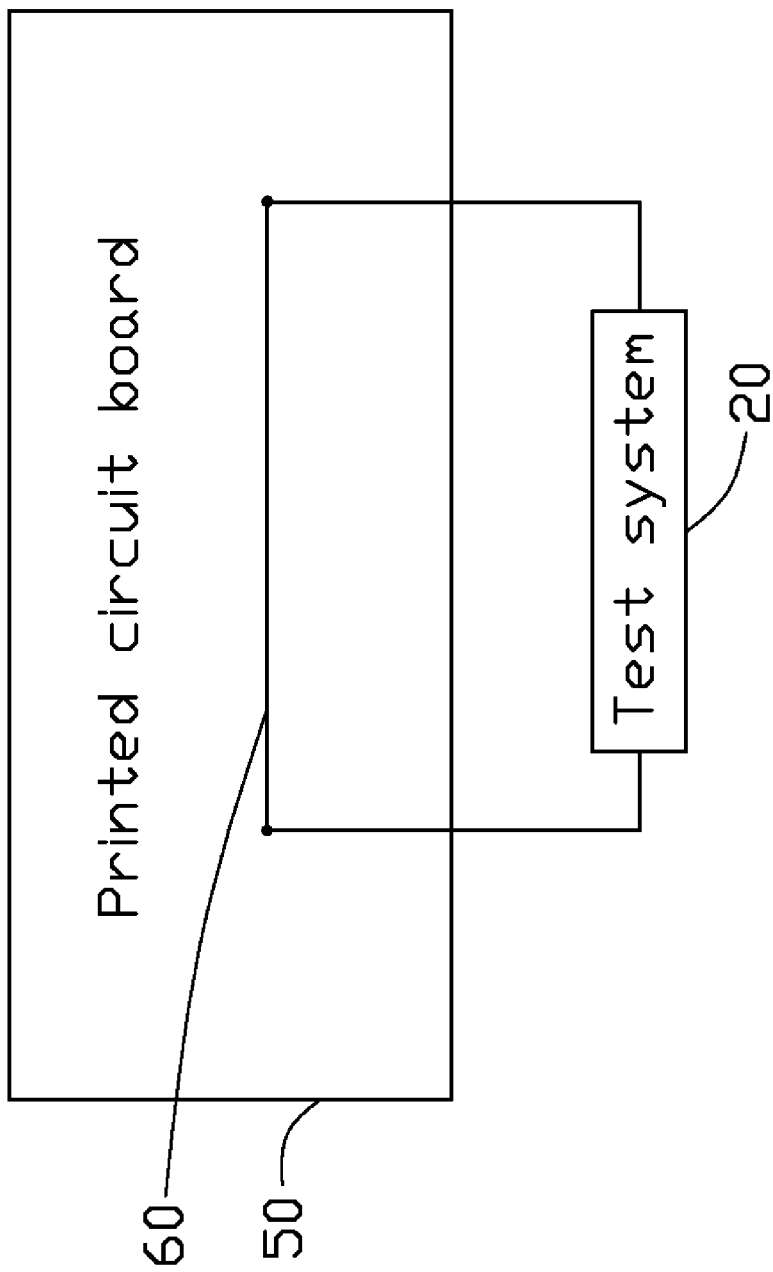
FIG. 6 is a block diagram of the test system of FIG. 1 measuring S-parameters of a signal trace.

A realistic example is described below using the compensating method to compensate S-parameters. Referring to FIG. 6, a signal trace 60 is laid on a printed circuit board 50. The procedure is as follows:

Step 201, the test system 20 measures S-parameters of the signal trace 60 at a frequency of 4.6372 GHZ, and forms an S-parameter matrix:
[(−0.2608352337196621+0.34762731259124221i, 0.7203853298827190+0.5405228611018837i), (0.7203853298827190+0.5405228611018837i, −0.2608352337196621+0.34762731259124221i)].

Step 202, in the above described S-parameter matrix, eigenvalues of the matrix $[E−S \times S']$ are $2.978085395288764 \times 10^{-6}$ and $-2.487071395607110 \times 10^{-6}$. One of the eigenvalues is smaller than 0, so the S-parameters of the signal trace 60 do not satisfy passivity.

Step 204, then, the compensating part 23 compensates by adjusting the S-parameters of the signal trace 60, as described below:

Step 301, the compensating part 23 gets the S-parameter matrix S=
[(−0.2608352337196621+0.34762731259124221i, 0.7203853298827190+0.5405228611018837i), (0.7203853298827190+0.5405228611018837i, −0.2608352337196621+0.34762731259124221i)].

Step 302, the matrix computing module 31 computes the matrix $[S \times S']$. The eigenvalue computing module 32 computes the eigenvalues of the matrix $[S \times S']$. Then, compare the eigenvalues, and get an eigenvalue $\Psi_{max}=1.000002487071396$ whose real part is the biggest.

Step 303, the compensating value computing module 33 then computes a compensating value ξ according to the compensating value formula of $\xi=\text{real}(\Psi_{max})^{1/2} \times (1+\epsilon)=1.000001243535925$. In the above equation, the ε is set to $1 \times 10^{-12}$.

Step 304, the compensating module 34 compensates the S-parameter matrix S according to the compensating module $S^*=S/\xi$ to get the compensated S-parameter matrix $S^*=$
[(−0.2608349093620819+0.3476268803047282, 0.7203844340587956+0.54052218894312381i), (0.7203844340587956+0.5405221 889431238I, −0.2608349093620819+0.3476268803047282)].

For the above matrix $S^*$, the eigenvalues of the matrix $[S^* \times S^{*'}]$ are $5.465145198668697 \times 10^{-6}$, and $2.000122290161193 \times 10^{-12}$. Both of the two eigenvalues are bigger than 0, so the matrix $S^*$ satisfies passivity.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for compensating S-parameters of a passive circuit which do not satisfy passivity, the method comprising the following steps:
   obtaining S-parameters which do not satisfy passivity by a compensating part, these S-parameters comprising a S-parameters matrix S;
   computing matrix $[S \times S']$ by a matrix computing module of the compensating part, wherein matrix S' is a complex conjugate transposed matrix of S-parameters matrix S;
   computing the eigenvalues of the matrix $[S \times S']$ by an eigenvalue computing module of the compensating part, and choosing an eigenvalue Ψ whose real part real(Ψ) is the biggest;
   computing a compensating value ξ by a compensating value computing module of the compensating part, and the compensating value ξ being equal to $\text{real}(\Psi)^{1/2} \times (1+\epsilon)$, wherein the ε is a very small positive number; and
   compensating the S-parameters by a compensating module of the compensating part to use the compensating value ξ to divide the S-parameters to get the compensated S-parameters.

2. The method as described in claim 1, wherein upon the condition that real parts of the eigenvalues of the matrix $[E−S \times S']$ in which the matrix S' is a complex conjugate transposed matrix of the S-parameters matrix and the matrix E is an identity matrix, are smaller than 0, the S-parameters do not satisfy passivity, and upon the condition that real parts of the eigenvalues of the matrix $[E−S \times S']$ is not smaller than 0, the S-parameters satisfy passivity.

3. An apparatus for compensating S-parameters of a passive circuit which do not satisfy passivity, the apparatus comprising:
   a matrix computing module capable of receiving the S-parameters which do not satisfy passivity, these S-parameters comprising a S-parameters matrix S, the matrix computing module computing matrix $[S \times S']$, wherein matrix S' is a complex conjugate transposed matrix of S-parameters matrix S;
   an eigenvalue module connected to the matrix computing module, the eigenvalue computing module capable of computing the eigenvalues of the matrix $[S \times S']$, and choosing an eigenvalue Ψ whose real part real(Ψ) is the biggest;

a compensating value computing module connected to the eigenvalue module, the compensating value computing module capable of computing a compensating value $\xi$ which is equal to $\text{real}(\Psi)^{1/2} \times (1+\epsilon)$, wherein the $\epsilon$ is a very small positive number; and a compensating module connected to the compensating value computing module, the compensating module capable of compensating the S-parameters by using the compensating value $\xi$ to divide the S-parameters to get the compensated S-parameters.

4. The apparatus as described in claim 3, wherein if real parts of the eigenvalues of the matrix $[E-S \times S']$, in which the matrix $S'$ is a complex conjugate transposed matrix of the S-parameters matrix and the matrix $E$ is an identity matrix, is smaller than 0, the S-parameters do not satisfy passivity, and if real parts of the eigenvalues of the matrix $[E-S \times S']$ is not smaller than 0, the S-parameters satisfy passivity.

\* \* \* \* \*